United States Patent
Huang et al.

(10) Patent No.: US 7,585,709 B2
(45) Date of Patent: Sep. 8, 2009

(54) DISPLAY PANELS AND FABRICATION METHODS THEREOF

(75) Inventors: Wei-Pang Huang, Hsinchu (TW); Shih-Lung Chen, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 12/126,041

(22) Filed: May 23, 2008

(65) Prior Publication Data

US 2008/0220551 A1    Sep. 11, 2008

Related U.S. Application Data

(63) Continuation of application No. 11/006,173, filed on Dec. 7, 2004, now Pat. No. 7,394,507.

(30) Foreign Application Priority Data

Jul. 2, 2004    (TW) ............................... 93119989 A

(51) Int. Cl.
*H01L 21/84* (2006.01)
*H01L 21/00* (2006.01)
*H01L 21/338* (2006.01)

(52) U.S. Cl. ................... 438/149; 438/150; 438/166; 438/168; 257/E21.133; 257/E21.134; 257/E21.412; 257/E21.535

(58) Field of Classification Search ......... 257/E21.133, 257/E21.134, E21.412, E21.535
See application file for complete search history.

(56) References Cited

U.S. PATENT DOCUMENTS

| | | |
|---|---|---|
| 4,600,274 A | 7/1986 | Morozumi |
| 5,253,091 A | 10/1993 | Kimura et al. |
| 5,436,747 A | 7/1995 | Suzuki |
| 5,760,850 A | 6/1998 | Nakanishi et al. |
| 6,197,624 B1 | 3/2001 | Yamazaki |
| 6,236,064 B1 | 5/2001 | Mase et al. |
| 6,392,810 B1 | 5/2002 | Tanaka |
| 6,522,066 B2 | 2/2003 | Sheu et al. |
| 6,524,877 B1 | 2/2003 | Nakazawa et al. |
| 6,555,420 B1 | 4/2003 | Yamazaki |
| 6,555,422 B1 | 4/2003 | Yamazaki et al. |
| 7,145,623 B2 | 12/2006 | Sasaki |
| 7,176,988 B2 | 2/2007 | Song |
| 7,407,840 B2 * | 8/2008 | Makimura et al. .......... 438/149 |
| 2005/0139925 A1 * | 6/2005 | You ........................... 257/351 |
| 2006/0255337 A1 * | 11/2006 | Jun et al. ...................... 257/59 |

FOREIGN PATENT DOCUMENTS

| | | |
|---|---|---|
| EP | 0460870 | 5/1999 |
| JP | 11095235 | 9/1999 |
| JP | 20011102595 | 4/2001 |
| JP | 2003228301 | 8/2003 |
| JP | 2004138912 | 5/2004 |
| TW | 240416 | 9/2005 |

OTHER PUBLICATIONS

English Abstract of JP2004138912.
English Abstract of JP20011102595.

* cited by examiner

*Primary Examiner*—Savitri Mulpuri
*Assistant Examiner*—Mohsen Ahmadi
(74) *Attorney, Agent, or Firm*—Thomas, Kayden, Horstemeyer & Risley

(57) ABSTRACT

A display panel including a pixel array region. The pixel array region includes a plurality of pixel cells disposed in a matrix configuration. Each pixel cell has an active device. A relative position of a first active device in a first pixel cell among the pixel cells is different from that of a second active device in a second pixel cell among the pixel cells.

4 Claims, 6 Drawing Sheets

DISPLAY PANELS AND FABRICATION METHODS THEREOF

CROSS REFERENCE TO RELATED APPLICATIONS

This application is a Continuation of U.S. patent application Ser. No. 11/006,173, filed Dec. 7, 2004 now U.S. Pat. No. 7,394,507 and entitled "DISPLAY PANELS AND FABRICATION METHODS THEREOF".

BACKGROUND

The invention relates to display panels, and in particular to display panels fabricated with low temperature poly-silicon process.

Thin film transistors (TFTs) in liquid crystal displays (LCDs) serve as pixel control elements. In general, TFTs can be divided into two categories, amorphous silicon TFT and poly-silicon TFT. The poly-silicon TFTs are typically applied in high-speed circuits and large LCDs due to high electron mobility, good IC density, and small leakage current thereof. In most LCDs, the poly-silicon TFTs are formed from low temperature poly-silicon (LTPS), so that size of the poly-silicon TFTs decreases and the aperture ratio increases.

FIG. 1 is a schematic diagram of a conventional display panel. A display panel 10 comprises a plurality of pixel cells 12 disposed in a matrix configuration. A polycrystalline semiconductor film is formed in advance on pixel cells 12 by a LTPS process. A laser then irradiates the polycrystalline semiconductor film corresponding to pixel cells 12 in each column to form the poly-silicon semiconductor film from polycrystalline semiconductor film. Eventually, a poly-silicon TFT 14 is formed in each pixel cell 12 by other processes.

Since the size of the laser beam is limited, the laser only irradiates the pixel cells in one column at a time and then irradiates the pixel cells in the next column by stepping. Accordingly, the characteristics of the pixel cells in the same column are the same. The intensity of each laser beam however is different, so that pixel cells irradiated by different laser beams yield the poly silicon TFTs with non-uniform characteristics. When the characteristics of the pixel cells in one column differ from that of the pixels in the other columns, the non-uniformity results in the display panel. This non-uniformity causes undesirable mura defects.

SUMMARY

Display panels are provided. An exemplary embodiment of a display panel comprises a pixel array region comprising a plurality of pixel cells disposed in matrix configuration. Each pixel cell has an active device. A relative position of a first active device among the active devices in a first pixel cell among the pixel cells differs from that of a second active device among the active devices in a second pixel cell among the pixel cells.

Fabrication methods for display panels are provided. An exemplary embodiment of a fabrication method comprises the following steps. The display panel comprises a pixel array region in which a plurality of pixel cells are disposed in a matrix configuration. Each pixel cell has an active device area. A column direction and a row direction are defined in the pixel array region. A polycrystalline semiconductor film is formed on the display panel and irradiated by a laser beam to form a poly-silicon semiconductor film therefrom. At least one active device in the pixel cells synchronously irradiated by the laser beam is not irradiated by the laser beam. At least one active device is formed in each active device area.

DESCRIPTION OF THE DRAWINGS

Display panels and fabrication methods thereof will become more fully understood from the detailed description given hereinbelow and the accompanying drawings, given by way of illustration only and thus not intended to be limitative of the invention.

DETAILED DESCRIPTION

Display panels are provided. In some embodiments, the relative positions of TFTs in pixel cells in a row or column are changed, so that at least one TFT is not irradiated by a laser beam when the laser beam irradiates all the pixel cells in a row or column.

Figure 2:
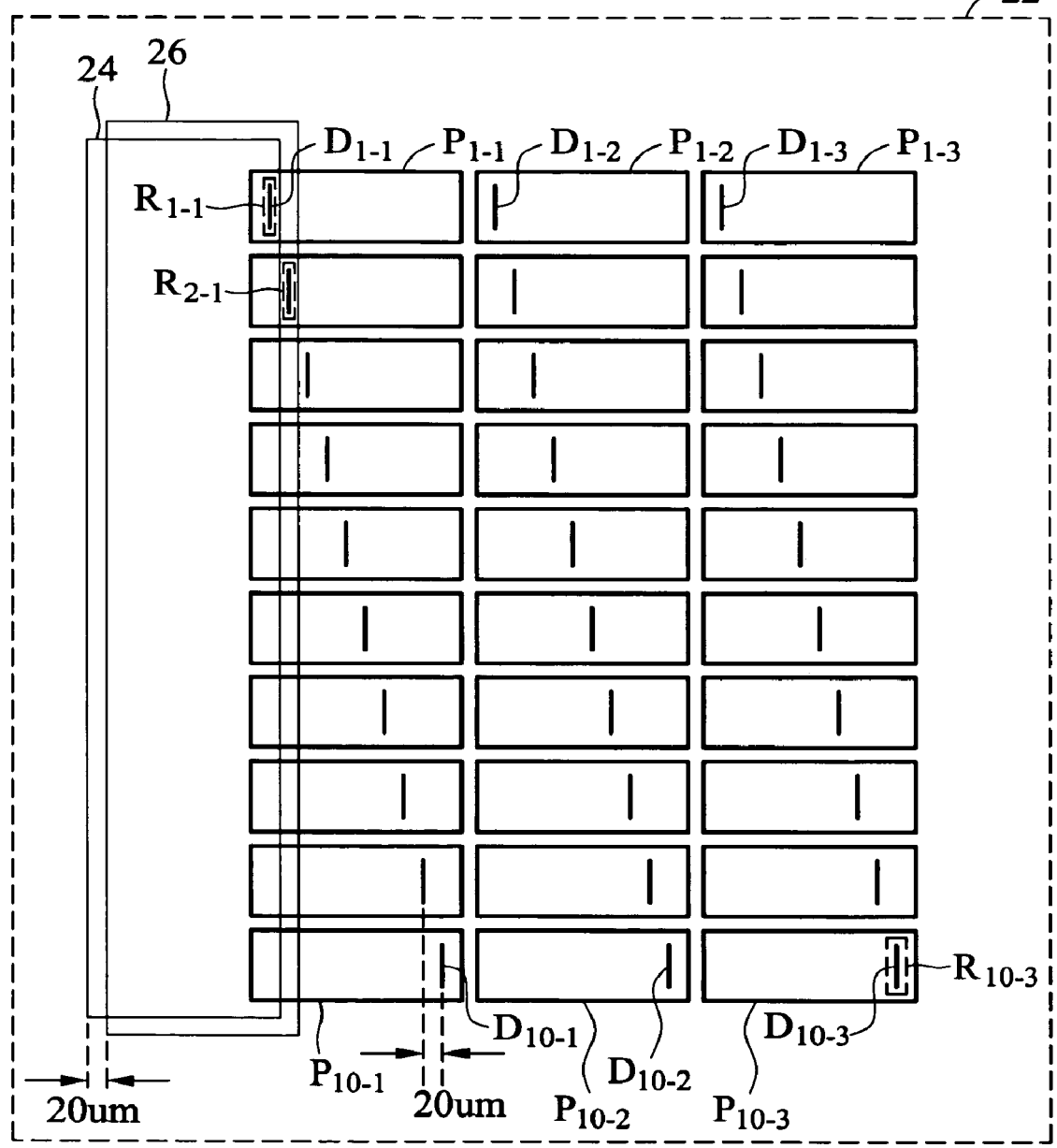
FIG. 2 shows an embodiment of a display panel.

In an exemplary embodiment, as shown in FIG. 2, a display panel 20 comprises a pixel array region 22. The pixel array region 22 comprises a plurality of pixel cells 12 disposed in a matrix configuration. In the embodiment shown in FIG. 2, a 3×10 pixel array region is given as an example.

The pixel cells $P_{1-1}$ to $P_{10-3}$ respectively have active devices $D_{1-1}$ to $D_{10-3}$, such as TFTs or the like. The relative positions of the active devices in the pixel cells in one column can be the same as, or different from those in the other columns. As shown in FIG. 2, the relative positions of the active devices in the pixel cells in the first column are the same as those in second and third columns. For example, the relative position of the active devices $D_{1-1}$ in the display cell $P_{1-1}$, that of active devices $D_{1-2}$ in the display cell $P_{1-2}$, and that of active devices $D_{1-3}$ in the display cell $P_{1-3}$ are the same. In the pixel cells in the same column, the relative position of the active device in each pixel cell, however, differs from that of the active device in the adjacent pixel cell. For example, referring to FIG. 2, in the pixel cells $P_{1-1}$ to $P_{10-1}$ in the first column, the relative position of the active device is shifted right according to that of the previous active device, and the shifting operation is performed in the direction from the active device $D_{1-1}$ to the active device $D_{10-1}$. The distance between the relative positions of the active devices in any two adjacent pixel cells in the same column has a constant value.

Figure 3:
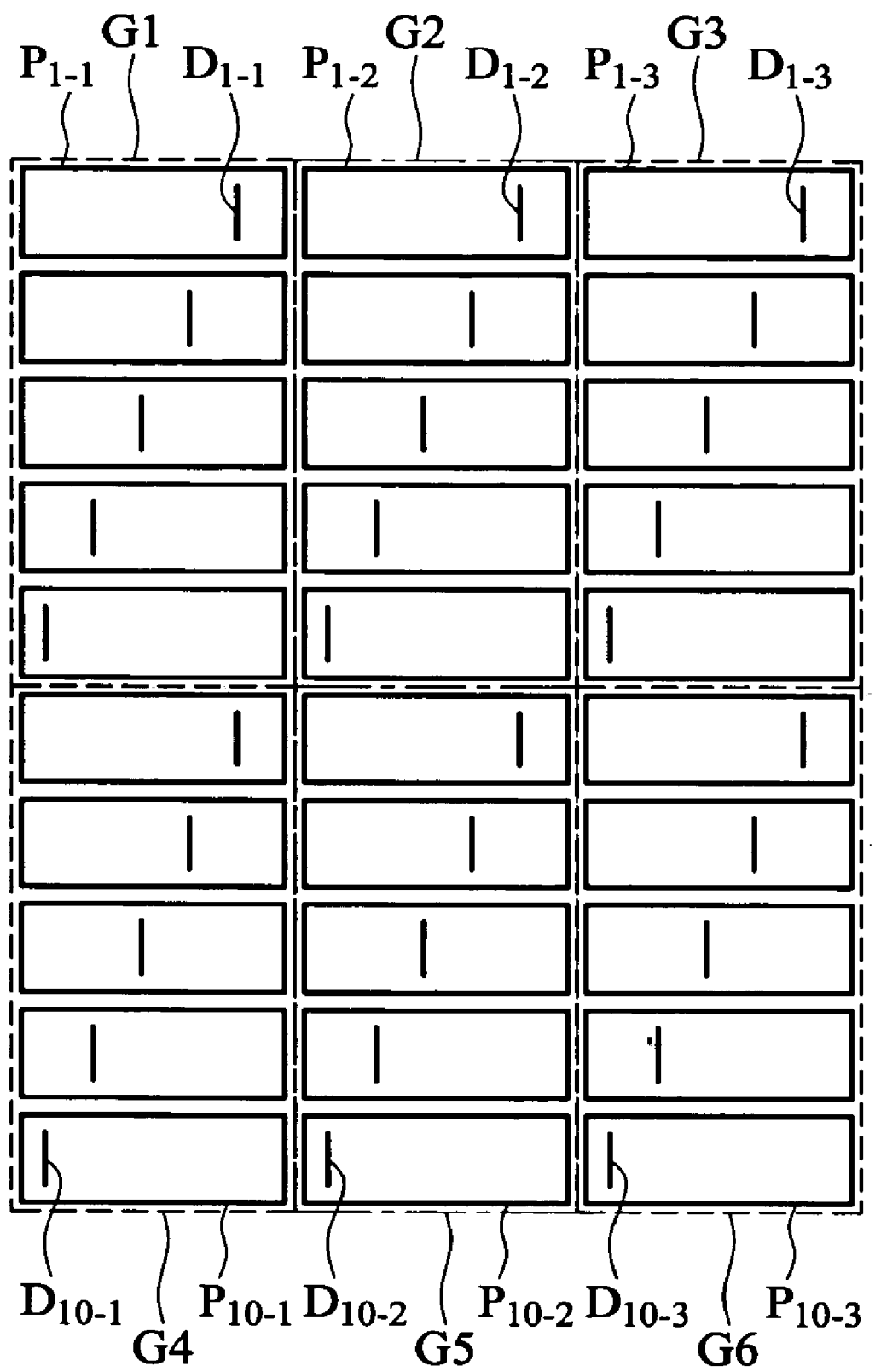
FIG. 3 shows an embodiment of a display panel.

In some embodiments, as shown in FIG. 3, all the pixel cells $P_{1-1}$ to $P_{10-3}$ are divided six groups G1 to G6. The relative positions of the active devices in the pixel cells in one group can be the same as or different from those in the other groups. In FIG. 3, the relative positions of the active devices in the pixel cells in group G1 are the same as those in groups G2 to G6.

In the pixel cells in the same group, the relative position of the active device in each pixel cell, however, differs from that of the active device in adjacent pixel cell. In an embodiment shown in FIG. 3, the relative positions of the active devices in the pixel cells in one group are arranged in a designated direction. For example, referring to FIG. 3, in the group G1, the relative position of the active device is shifted left according to that of the previous active device, and the shifting operation is performed in a top-down direction. The distance between the relative positions of the active devices in any two adjacent pixel cells in the same group has a constant value.

Figure 4:
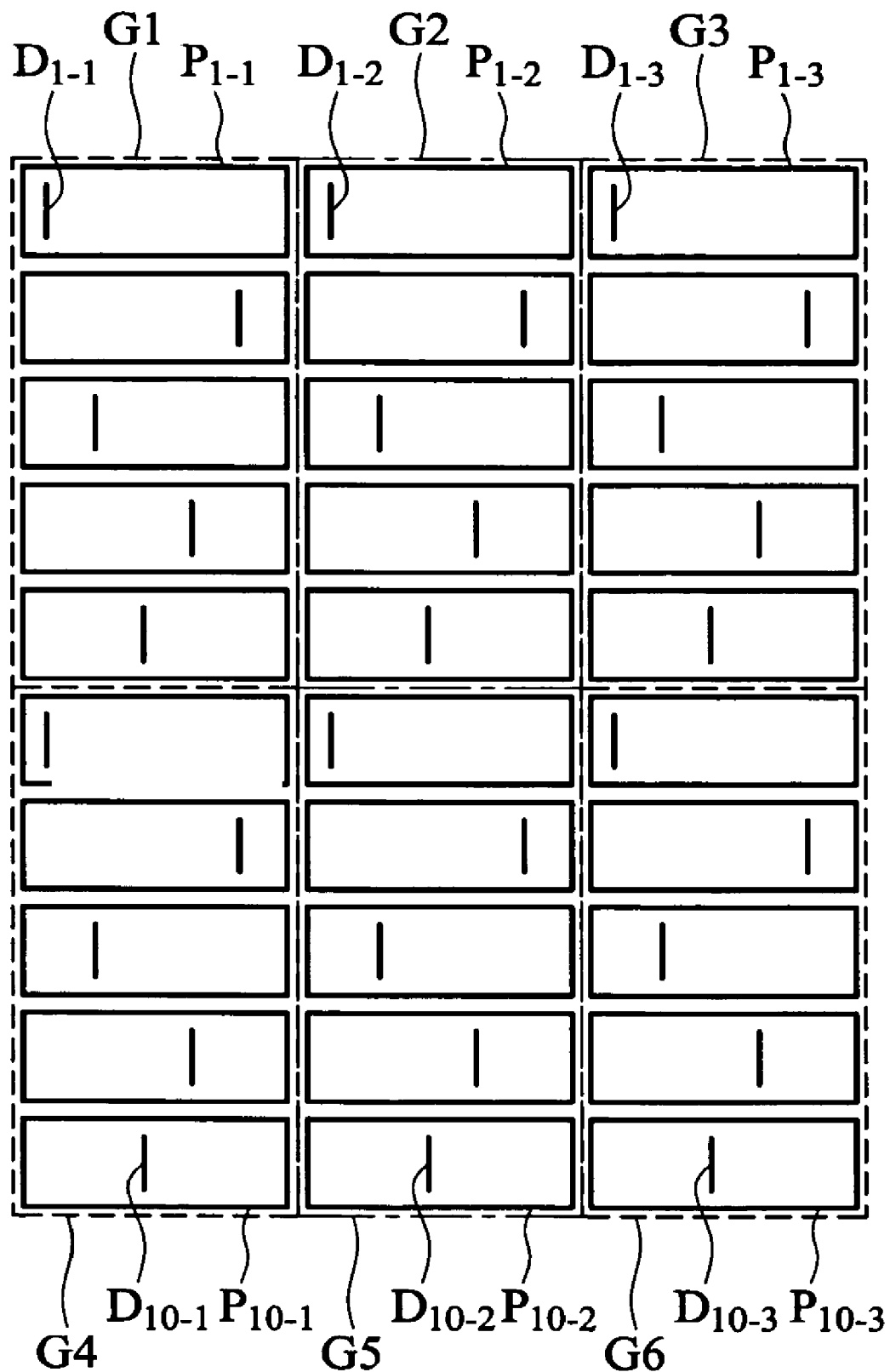
FIG. 4 shows an embodiment of a display panel.

In an embodiment, as shown in FIG. 4, all the pixel cells $P_{1-1}$ to $P_{10-3}$ are divided six groups G1 to G6. Compared with the embodiment of the display panel shown in FIG. 3, the pixel cell in each pixel in FIG. 4 are randomly disposed.

Figure 5:
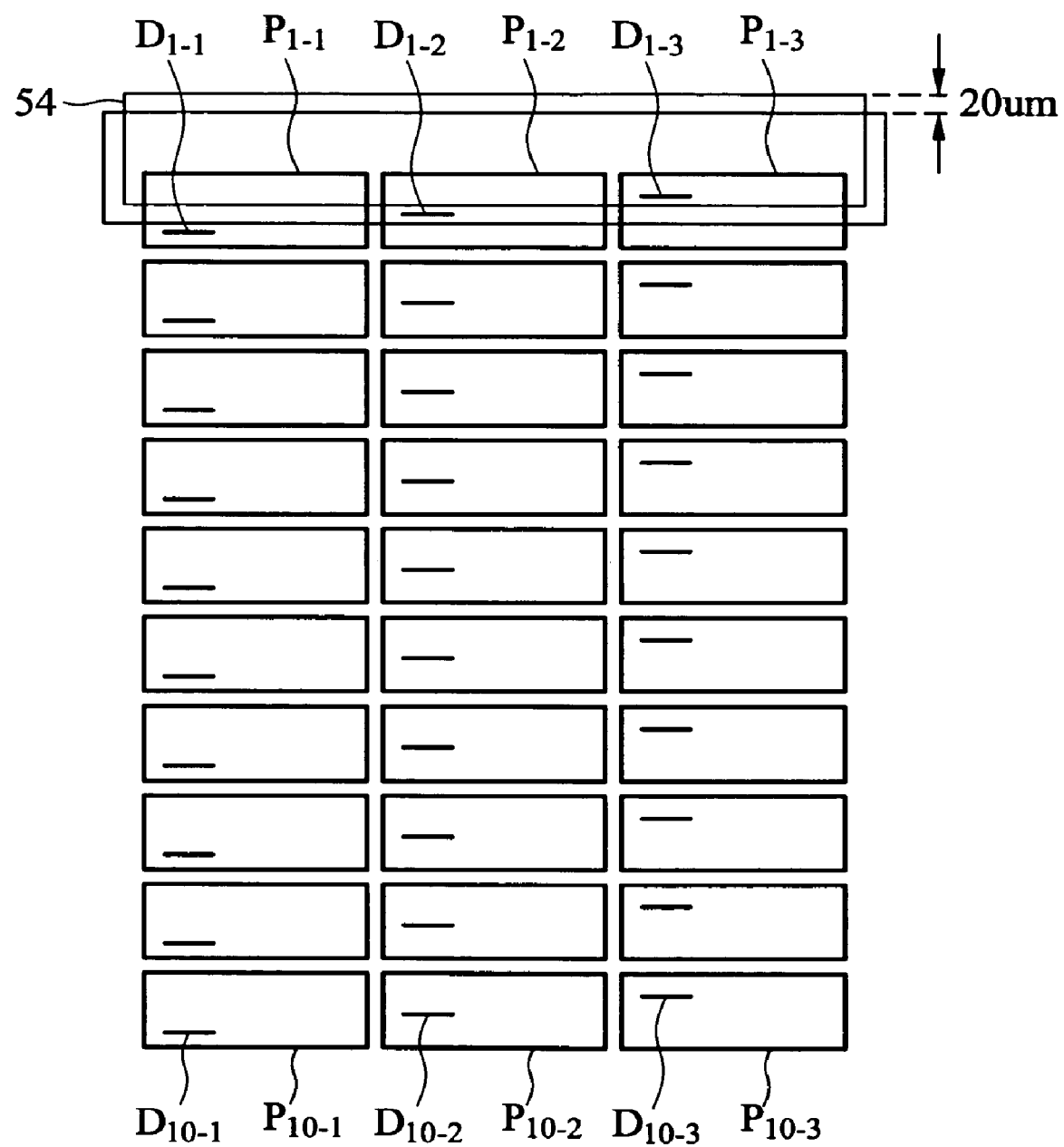
FIG. 5 shows an embodiment of a display panel.

In an embodiment, as shown in FIG. 5, the relative positions of the active devices in the pixel cells in one row are the same as those in the other rows. In the pixel cells in the same row, the relative position of the active device in each pixel cell however is different from that of the active device in the adjacent pixel cell. Referring to FIG. 5, in the pixel cells in the same row, the relative position of the active device is shifted up according to that of the previous active device, and the shifting operation is performed in a left-right direction.

Figure 6:
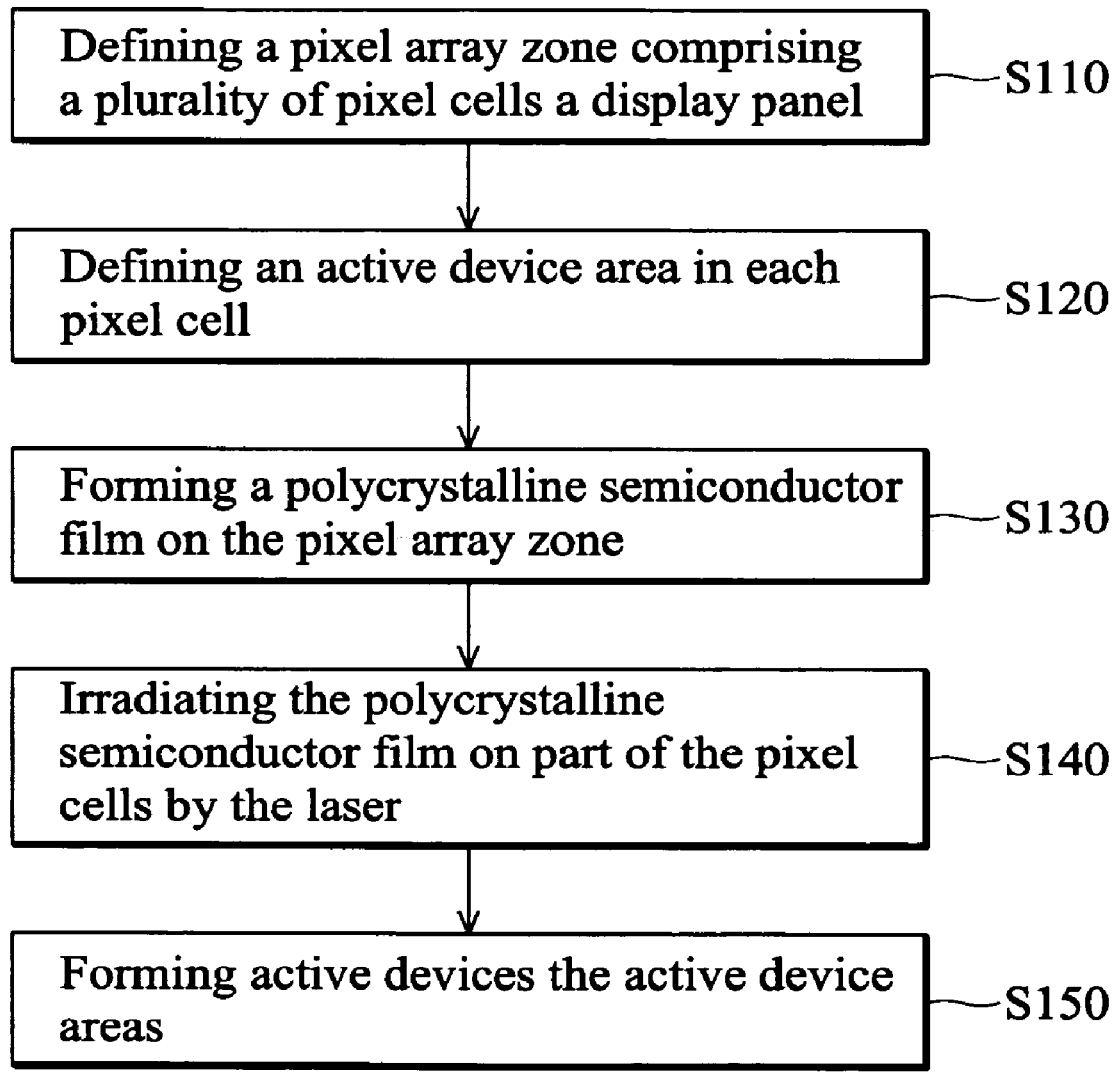
FIG. 6 is a flow chart of an embodiment of a fabrication method of a display panel.

FIG. 6 is a flow chart of an embodiment of a fabrication method of a display panel. Referring FIGS. 2 and 6, first, a pixel array region 22 comprising a plurality of pixel cells $P_{1-1}$ to $P_{10-3}$ in a matrix configuration defined in a display panel 20 (step S110).

Active device areas $R_{1-1}$ to $R_{10-3}$ are respectively defined in pixel cells $P_{1-1}$ to $P_{10-3}$ (step S120). As shown in FIG. 2, in the pixel cells in the same column, the relative position of the active device area in each pixel cell is different from that of the active device area in the adjacent pixel cell. For example, in the pixel cells $P_{1-1}$ to $P_{10-1}$ in the first column, the relative position of the active device area is shifted right according to that of the previous active device area, and the shifting operation is performed in a direction from the active device area $R_{1-1}$ to the active device area $R_{10-1}$. The distance between the relative positions of the active device areas in any two adjacent pixel cells in the same column is a constant value.

In LTPS process, a polycrystalline semiconductor film is formed on the pixel array region 22 (step S130). A laser irradiates the polycrystalline semiconductor film on part of the pixel cells 12 (step S140) to form the poly-silicon semiconductor film from polycrystalline semiconductor film.

The pixel array region 22 shown in FIG. 2 is given as an example. First, the laser irradiates the polycrystalline semiconductor film corresponding to an area 24 of the pixel array region 22 in a column direction, serving as a syn-process direction. At this time, the area 24 serves as a laser syn-process area.

After the laser irradiates polycrystalline semiconductor film corresponding to the area 24, the laser moves right by stepping. It is assumed that the laser moves at least 20 um, so that the distance between the relative positions of the active device areas in any two adjacent pixel cells in the same column is set at 20 um.

The laser moves right 20 um from the area 24 for irradiating the polycrystalline semiconductor film corresponding to an area 26. At this time, the laser syn-process area is changed to the area 26.

After irradiating the polycrystalline semiconductor film corresponding to an area 26, the laser moves continually right to irradiate the residual polycrystalline semiconductor film. Since the relative positions of the active device areas in pixel cells are different from each other, the laser irradiates different active device areas at the same time.

In order to obtain fine crystal quality, the laser can irradiate the polycrystalline semiconductor film repeatedly. It is assumed that the width of the laser beam is 400 um. Each active device can be irradiated 20 times. Since any two adjacent active device areas are not simultaneously irradiated at least one time, the crystal qualities of the active device areas are not identical.

Finally, active devices, such as TFT or other active devices, are formed in the active device areas by masking and etching (step S150). Since the crystal qualities of the active device areas are not identical, the characteristics of the TFTs in the active device areas in the same column are different from each other.

In FIG. 2, the syn-process direction of the laser is a column direction. Moreover, the syn-process direction of the laser can be a row direction. As shown in FIG. 5, the laser irradiates the polycrystalline semiconductor film corresponding to an area 54. The laser then moves down a constant distance to irradiate the polycrystalline semiconductor film corresponding to another area.

Figure 1:
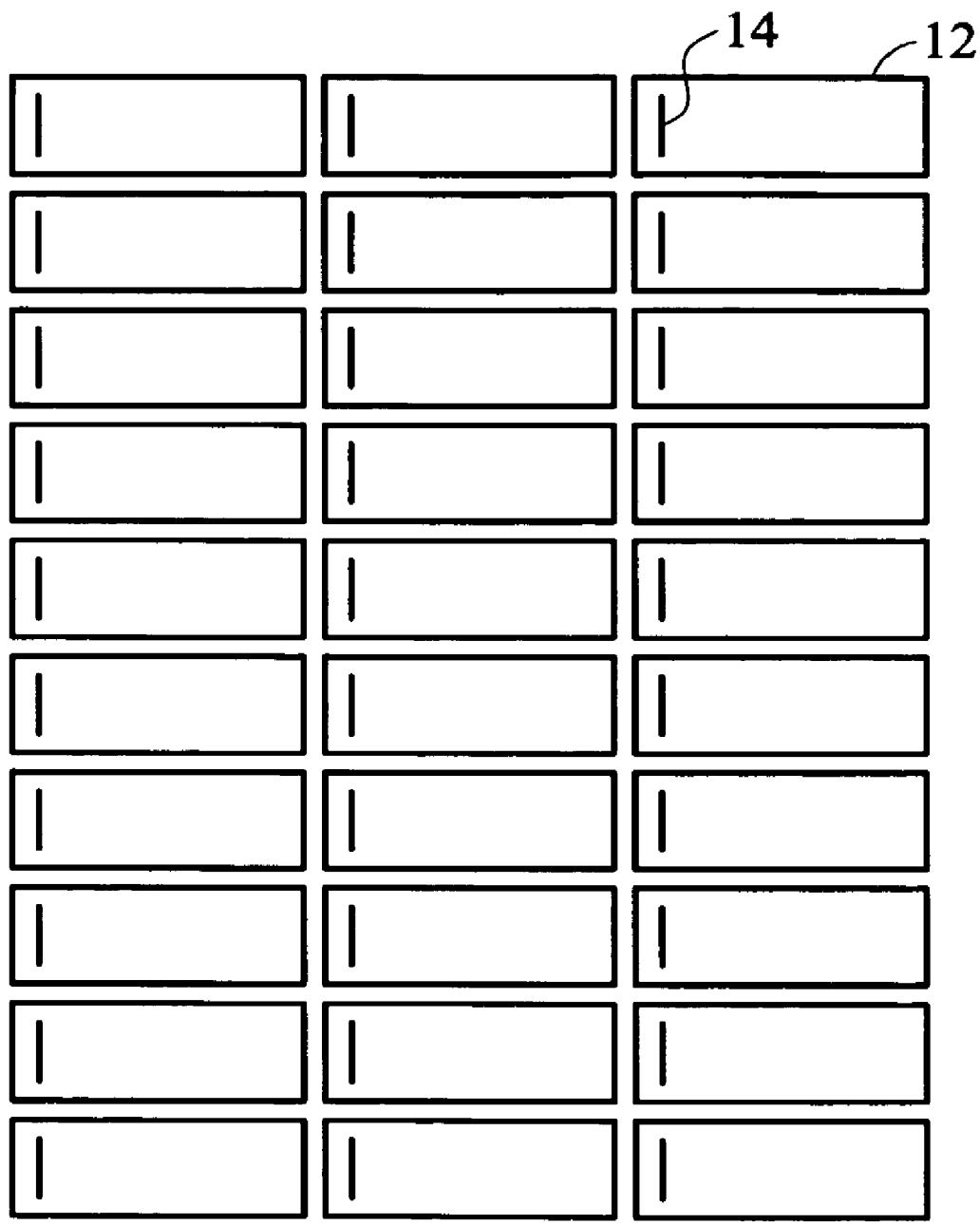
FIG. 1 shows a conventional display panel.

Referring to the conventional display panel as shown in FIG. 1, in the same column, since the TFTs in the pixel cells are irradiated by the same laser beam, the characteristics of the TFTs are uniform. When the intensity of the leaser beams is different, undesirable mura effects occur in a certain column in the display panel.

In some embodiments, as shown in FIG. 2, since the laser cannot irradiate all the active device areas in the pixel cells in the same column at the same time, the characteristics of the active devices in the same column are non-uniform. Thus, undesirable mura effects cannot occur in a certain column to prevent the display panel from line muras.

Finally, while the invention has been described in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A fabrication method for a display panel comprising a pixel array region in which a plurality of pixel cells disposed in matrix configuration, each pixel cell having an active device area, the fabrication method comprising:
    forming a polycrystalline semiconductor film on the display panel;
    irradiating the polycrystalline semiconductor film by a laser beam to form a poly-silicon semiconductor film from the polycrystalline semiconductor film; and
    forming one active device in each active device area;
    wherein, first, second, third pixel cells among the plurality of pixel cells are disposed continuously in one column of the matrix configuration, and a relative position of the active device in the first pixel cell is different from that of the active device in the third pixel cell;
    wherein in one column of the matrix configuration, the relative positions of the active devices of the pixel cells are different from each other; and
    wherein in one row of the matrix configuration, relative positions of the active devices of the pixel cells are the same.

2. The fabrication method as claimed in claim 1, wherein the active device is a thin film transistor.

3. The fabrication method as claimed in claim 1, wherein in the same column of the matrix configuration, a distance between the relative positions of the two adjacent pixel cells is larger than 20um.

4. The fabrication method as claimed in claim 1 further comprising defining at least two laser syn-process areas in the pixel array region, wherein the active device in the first pixel cell and the active device in the third pixel cell are not disposed in the same laser syn-process area.

* * * * *